(12) United States Patent
Chen et al.

(10) Patent No.: US 10,930,221 B2
(45) Date of Patent: Feb. 23, 2021

(54) LIGHT EMITTING UNIT, DRIVING METHOD THEREOF, AND DISPLAY DEVICE

(71) Applicant: BOE TECHNOLOGY GROUP CO., LTD., Beijing (CN)

(72) Inventors: Liang Chen, Beijing (CN); Lei Wang, Beijing (CN); Xiaochuan Chen, Beijing (CN); Minghua Xuan, Beijing (CN); Li Xiao, Beijing (CN); Dongni Liu, Beijing (CN); Shengji Yang, Beijing (CN); Pengcheng Lu, Beijing (CN); Ning Cong, Beijing (CN); Detao Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/424,870

(22) Filed: May 29, 2019

(65) Prior Publication Data

US 2019/0378464 A1 Dec. 12, 2019

(30) Foreign Application Priority Data

Jun. 8, 2018 (CN) .......................... 201810587055.5

(51) Int. Cl.
*G09G 3/3291* (2016.01)
*H01L 51/52* (2006.01)
(52) U.S. Cl.
CPC ....... *G09G 3/3291* (2013.01); *H01L 51/5296* (2013.01); *G09G 2300/043* (2013.01)
(58) Field of Classification Search
CPC combination set(s) only.
See application file for complete search history.

(56) References Cited

U.S. PATENT DOCUMENTS

| 8,796,937 | B2 | 8/2014 | Wang et al. |
| 9,054,339 | B2 | 6/2015 | Mok et al. |
| 10,424,250 | B2 | 9/2019 | Wang |

(Continued)

FOREIGN PATENT DOCUMENTS

| CN | 101763807 A | 6/2010 |
| CN | 102467877 A | 5/2012 |

(Continued)

OTHER PUBLICATIONS

Office Action dated Sep. 29, 2019 issued in corresponding Chinese Application No. 201810587055.5.

*Primary Examiner* — Van N Chow
(74) *Attorney, Agent, or Firm* — Nath, Goldberg & Meyer; Joshua B. Goldberg

(57) ABSTRACT

The present disclosure provides a light emitting unit, a driving method thereof, and a display device, belongs to the field of organic light emitting transistor (OLET) display technology, and can at least partially solve the problem of high power consumption of an existing OLET display technique. The light emitting unit includes an OLET and a driving circuit. The driving circuit is coupled to a control electrode and a first electrode of the OLET, and is configured to provide a data voltage to the control electrode of the OLET and provide a compensation voltage correlated with the data voltage to the first electrode of the OLET. A second electrode of the OLET is coupled to a first constant voltage terminal.

19 Claims, 5 Drawing Sheets

(56) References Cited

U.S. PATENT DOCUMENTS

2005/0110725 A1* 5/2005 Kwak ................ G09G 3/3233
345/76
2014/0124759 A1* 5/2014 Mok .................. H01L 51/057
257/40
2019/0228709 A1* 7/2019 Wang ................ G09G 3/3233

FOREIGN PATENT DOCUMENTS

| CN | 102709310 A | 10/2012 |
| CN | 103021335 A | 4/2013 |
| CN | 103811673 A | 5/2014 |
| CN | 107657919 A | 2/2018 |

* cited by examiner

Driver IC

LIGHT EMITTING UNIT, DRIVING METHOD THEREOF, AND DISPLAY DEVICE

CROSS-REFERENCE TO RELATED APPLICATION

The present application claims priority to Chinese Patent Application No. 201810587055.5, filed on Jun. 8, 2018, the disclosure of which is hereby incorporated by reference in its entirety.

TECHNICAL FIELD

The present disclosure relates to the field of organic light emitting transistor (OLET) display technology, and in particular, to a light emitting unit, a driving method thereof, and a display device.

BACKGROUND

An organic light emitting field effect transistor (OLET) is also called an organic light emitting transistor, which is a device formed by combining an organic light emitting diode (OLED) and an organic thin film transistor (OTFT).

In an organic light emitting field effect transistor, two types of charge carriers, namely, holes and electrons, are recombined in the organic semiconductor layer to emit light, and brightness of the emitted light is generally adjusted by controlling the gate voltage. Compared with an OLED, the OLET has higher carrier mobility, can effectively reduce exciton quenching and obtain higher luminous efficiency and brightness. Therefore, OLETs have broad application prospects in the fields of flat panel display, optical communication, solid lighting, electrically pumped organic lasers, and the like.

SUMMARY

In an aspect, embodiments of the present disclosure provide a light emitting unit including an organic light emitting field effect transistor (OLET) and a driving circuit, wherein the driving circuit is coupled to a control electrode and a first electrode of the OLET, and is configured to provide a data voltage to the control electrode of the OLET and provide a compensation voltage correlated with the data voltage to the first electrode of the OLET; and a second electrode of the OLET is coupled to a first constant voltage terminal.

In an embodiment, the compensation voltage is positively correlated with the data voltage.

In an embodiment, relationship between the compensation voltage Vb and the data voltage Vdata satisfies: Vb=βVdata, where β is a constant greater than one.

In an embodiment, the driving circuit includes a voltage supply source having a first output terminal coupled to the control electrode of the OLET, and a second output terminal coupled to the first electrode of the OLET; and the voltage supply source is configured to supply the data voltage at the first output terminal and supply the compensation voltage at the second output terminal.

In an embodiment, the driving circuit includes a voltage supply source and a voltage transformation circuit, an output terminal of the voltage supply source is coupled to the control electrode of the OLET and an input terminal of the voltage transformation circuit, and an output terminal of the voltage transformation circuit is coupled to the first electrode of the OLET;

the voltage supply source is configured to provide the data voltage at the output terminal thereof; and the voltage transformation circuit is configured to convert the data voltage into the compensation voltage.

In an embodiment, the voltage transformation circuit is an operational amplifier.

In an embodiment, the driving circuit includes a first voltage supply source and a second voltage supply source, and an output terminal of the first voltage supply source is coupled to the control electrode of the OLET;

an output terminal of the second voltage supply source is coupled to the first electrode of the OLET;

the first voltage supply source is configured to supply the data voltage at the output terminal thereof; and the second voltage supply source is configured to supply the compensation voltage at the output terminal thereof.

In an embodiment, the driving circuit includes a write circuit and a compensation circuit, wherein:

the write circuit is coupled to the control electrode of the OLET and the compensation circuit and is configured to supply the data voltage to the control electrode of the OLET and the compensation circuit; and the compensation circuit is coupled to the first electrode of the OLET and the write circuit, and is configured to generate the compensation voltage according to the data voltage supplied by the write circuit, and provide the compensation voltage to the first electrode of the OLET.

In an embodiment, the compensation circuit includes: a voltage dividing resistor and a voltage dividing transistor, the voltage dividing resistor has a first terminal coupled to a second constant voltage terminal and a second terminal coupled to the first electrode of the OLET; and the voltage dividing transistor has a control electrode coupled to the control electrode of the OLET and the write circuit, a first electrode coupled to the first electrode of the OLET, and a second electrode coupled to a third constant voltage terminal.

In an embodiment, the control electrode of the voltage dividing transistor is coupled to the control electrode of the OLET through a protection resistor.

In an embodiment, the write circuit includes a switching transistor having a control electrode configured to receive a control signal, a first electrode configured to receive the data voltage, and a second electrode coupled to the control electrode of the OLET.

In an embodiment, the light emitting unit further includes:

a storage capacitor having a first terminal coupled to the control electrode of the OLET and configured to maintain the data voltage of the control electrode of the OLET, and a second terminal coupled to the first electrode of the OLET.

In an embodiment, the compensation circuit is an operational amplifier.

In another aspect, embodiments of the present disclosure provide a display device including a plurality of light emitting units arranged in multiple rows and multiple columns, at least part of the plurality of light emitting units being the above-described light emitting unit.

In an embodiment, in a case where the driving circuit of the light emitting unit includes the voltage supply source, the voltage supply sources of the plurality of light emitting units are integrated into one driving chip.

In an embodiment, in a case where the driving circuit of the light emitting unit includes the first voltage supply source and the second voltage supply source, the first voltage supply sources of the driving circuits of the plurality of light emitting units are integrated into one driving chip, and the second voltage supply sources of the driving circuits of the plurality of light emitting units are integrated into another driving chip.

In an embodiment, in a case where the driving circuit of the light emitting unit includes the write circuit and the compensation circuit, the display device further includes a plurality of gate lines and a plurality of data lines, the write circuits of the light emitting units in a same row are coupled to a same gate line to receive the control signal through the gate line, and the write circuits of the light emitting units in a same column are coupled to a same data line to receive the data voltage through the data line.

In still another aspect, embodiments of the present disclosure provide a driving method of the above light emitting unit, which includes:

supplying a data voltage to the control electrode of the OLET, supplying a compensation voltage correlated with the data voltage to the first electrode of the OLET, and supplying a first constant voltage to the first constant voltage terminal to cause the OLET to emit light, wherein the first constant voltage is lower than the compensation voltage.

DETAILED DESCRIPTION

To enable those skilled in the art to better understand technical solutions of the present disclosure, the present disclosure will be further described in detail below in conjunction with the drawings and specific implementations.

Figure 1:
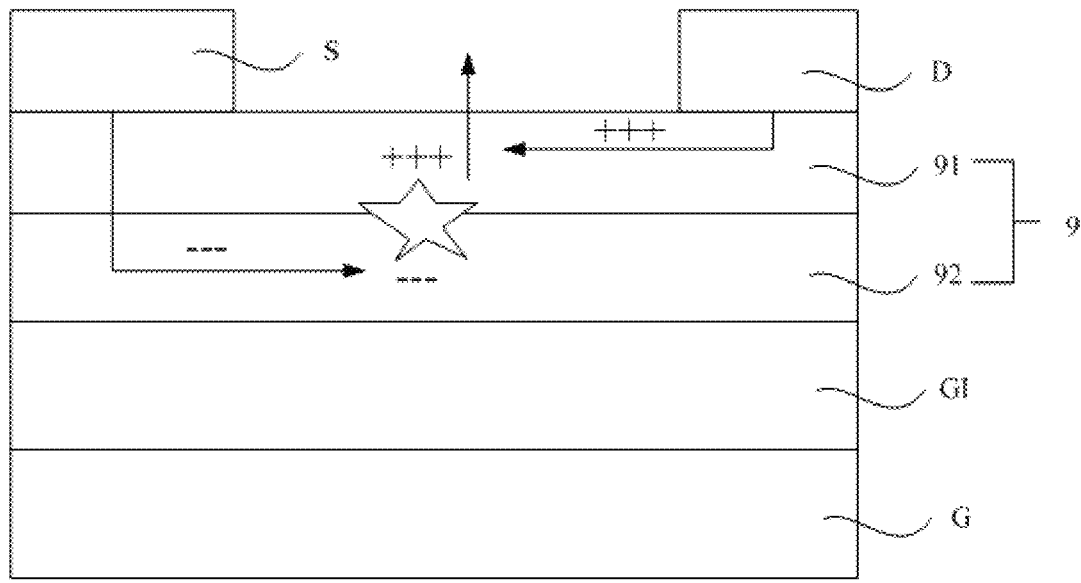
FIG. 1 is a schematic cross-sectional view of a structure of an OLET.

As shown in FIG. 1, an organic light emitting field effect transistor has a source S, a drain D, a gate G, a gate insulation layer GI, and an organic semiconductor layer 9 (which, e.g., may include a hole transport layer 91, and an electron transport layer 92). The organic light emitting transistor (OLET) emits light by recombination of holes and electrons, and therefore, brightness of the emitted light is determined by the charge carriers whose number is smaller.

Figure 3:
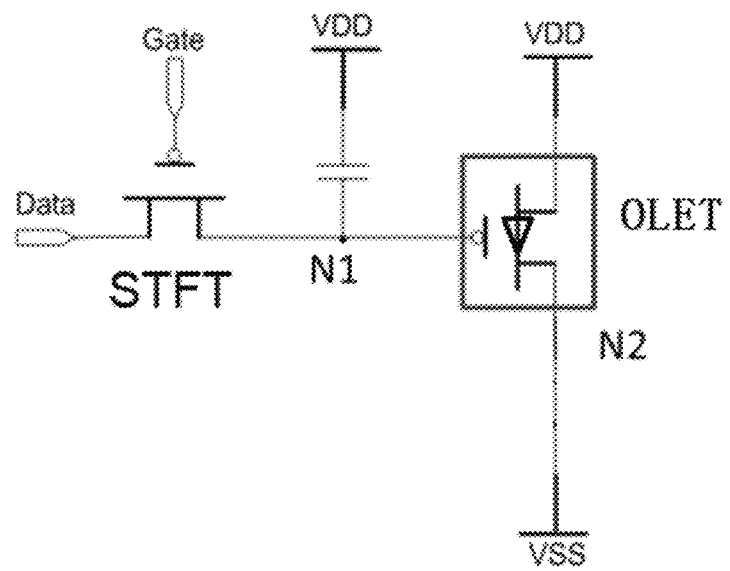
FIG. 3 is a schematic diagram of a 2T1C driving circuit of an OLET.
Figure 4:
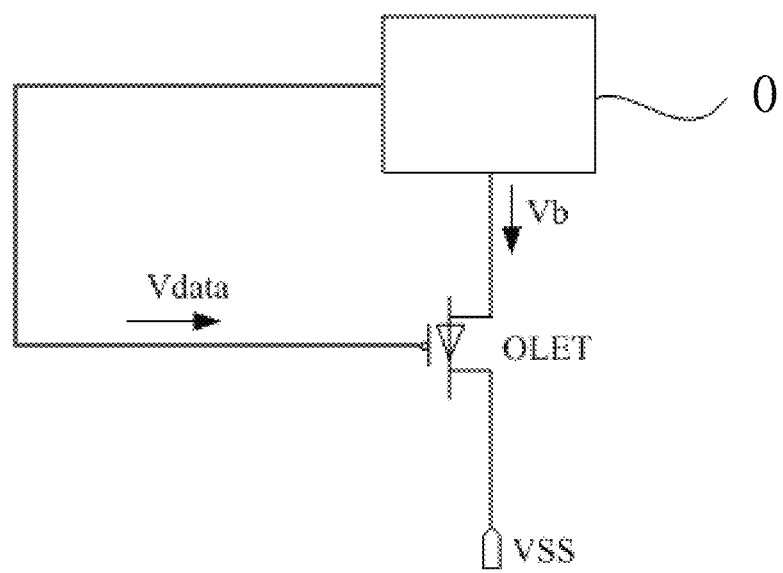
FIG. 4 is a schematic block diagram of a structure of a light emitting unit according to an embodiment of the present disclosure.

A channel current Isd of the OLET is actually composed of an electron current Ie and a hole current Ih, and although the channel current Isd changes correspondingly as a gate voltage Vgg of the OLET changes, the electron current Ie and the hole current Ib of the channel current change in different directions (one increases and the other decreases). For example, as shown in FIG. 3, in a case where the OLET is driven by the 2T1C driving circuit for an OLED, a difference between the electron current Ie and the hole current Ih increases as the gate voltage Vgg changes, resulting in an increased proportion of the current that cannot be used for emitting light, decreased luminous efficiency, and increased power consumption. Therefore, the existing 2T1C driving circuit for an OLED cannot be adopted in the OLET, and a new driving circuit needs to be introduced for the OLET. To this end, the present disclosure, inter alia, provides a light emitting unit, a driving method thereof, and a display device.

According to an aspect of the present disclosure, embodiments of the present disclosure provide a light emitting unit. As shown in FIG. 3, the light emitting unit includes an organic light emitting field effect transistor OLET and a driving circuit 0. The driving circuit 0 is coupled to a control electrode (e.g., a gate) and a first electrode of the organic light emitting field effect transistor OLET, respectively, and is configured to supply a data voltage to the control electrode of the organic light emitting field effect transistor OLET and supply, to the first electrode of the organic light emitting field effect transistor OLET, a compensation voltage correlated with the data voltage. The light emitting unit of the embodiment realizes light emission through an organic light emitting field effect transistor OLET, and thus is essentially an OLET light emitting unit. During light emission of the organic light emitting field effect transistor OLET, the driving circuit 0 controls brightness of the light emitted from the organic light emitting field effect transistor OLET by supplying a voltage (data voltage Vdata) to the gate of the organic light emitting field effect transistor OLET and supplying simultaneously a compensation voltage Vb correlated with the data voltage Vdata to the first electrode of the organic light emitting field effect transistor OLET. In this case, the voltage of the first electrode of the organic light emitting field effect transistor OLET is not a constant voltage, but changes as the gate voltage thereof changes. Needless to say, it should be understood that in order to enable the organic light emitting field effect transistor OLET to emit light, its second electrode should be supplied with a certain voltage (e.g., coupled to a first constant voltage terminal VSS). In some embodiments, a voltage of the first constant voltage terminal VSS is lower than the compensation voltage applied to the first electrode, for example, the first voltage terminal VSS may be grounded, that is, the voltage of VSS may be zero.

As the gate voltage of the organic light emitting field effect transistor OLET changes, the hole current and the electron current in the organic light emitting field effect transistor OLET change in opposite directions, and the difference between the hole current and the electron current increases. By adjusting the voltage of the first electrode of the organic light emitting field effect transistor OLET, the difference between the hole current and the electron current can be reduced, thereby reducing the proportion of the current that cannot be used for recombination to emit light (or reducing an increase of the current that cannot be used for recombination to emit light), so as to maintain the luminous efficiency as high as possible, and keep low power consumption.

Figure 2:
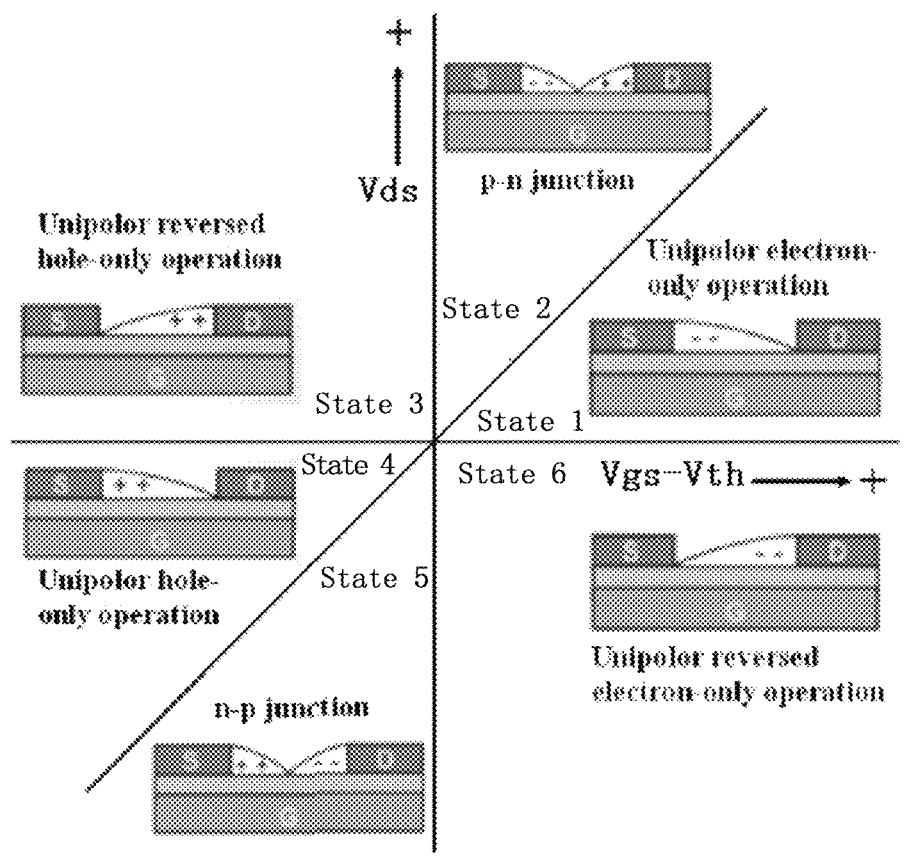
FIG. 2 is a diagram illustrating operation principle of an OLET in different states.

The organic light emitting field effect transistor OLET can adjust injection barriers of charge carriers by controlling a gate voltage Vgg, so as to control injection amounts of the two types of charge carriers; and by controlling a drain-source voltage Vds, a transverse electric field can be generated, so that the charge carriers move under the action of the transverse electric field to form a channel current Isd. As shown in FIG. 2, the organic light emitting field effect transistor OLET may operate in the following states according to different relationship between voltages of the electrodes.

State 1: in a case where 0<Vds<Vgs−Vth (Vgs is a gate-source voltage, Vth is a threshold voltage), electrons can overcome the injection barrier and be injected from the source, in contrast, holes cannot overcome the potential barrier to be injected from the drain, therefore, the transistor is in an electron transport state, the channel current Isd mainly includes the electron current Ie, and the transistor does not emit light.

State 2: as the drain-source voltage Vds increases, 0<Vgs−Vth<Vds is satisfied, consequently, a hole potential barrier at the drain is gradually reduced, and finally holes can be successfully injected from the drain and move to the source under the action of the transverse electric field; electrons move in a same manner as in state 1, therefore, the transistor is in a state that electrons and holes are simultaneously transferred, the channel current Isd is the sum of the electron current Ie and the hole current Ih, and the electrons and the holes are recombined, so that the transistor can emit light.

State 3: in a case where Vgs−Vth<0 and Vds>0, holes can overcome the injection barrier to be injected from the drain and transferred under the action of the transverse electric field, therefore, the transistor is in a hole transport state, the channel current Isd mainly includes the hole current Ih, and the transistor does not emit light.

State 4: in a case where Vgs−Vth<Vds<0, the transverse electric field has a direction opposite to that in state 1, therefore, holes will be injected from the source and collected at the drain, the transistor is in the hole transport state, the channel current Isd mainly includes the hole current Ih, and the transistor does not emit light.

State 5: in a case where Vds, which is negative, is further decreased until its absolute value is greater than that of Vgs−Vth, i.e., Vds<Vgs−Vth<0, electrons also overcome the potential barrier and are injected from the drain, therefore, the transistor is also in the state that electrons and holes are simultaneously transferred, the channel current Isd is the sum of the electron current Ie and the hole current Ih, and the electrons and the holes are recombined, so that the transistor can emit light.

State 6: in a case where Vgs−Vth>0 and Vds<0, only electrons can overcome the potential barrier to be injected from the drain and collected at the source, the transistor is in the electron transport state, the channel current Isd mainly includes the electron current Ie, and the transistor does not emit light.

It should be understood that for an organic light emitting field effect transistor OLET itself, the first electrode and the second electrode have no difference in structure, but are two opposite electrodes. Therefore, the above states 4 to 6 and states 1 to 3 are actually two opposite state sets corresponding to opposite voltage relations between the first electrode and the second electrode, and only differ in that the electrodes with higher voltages are different, and the corresponding currents flow in different directions.

According to the above description of the states of the organic light emitting field effect transistor OLET, states 2 and 5 are for light emission, and description is given below by taking a case where Vds>0 as an example.

Since an organic light emitting field effect transistor OLET emits light by recombination, an intensity of the emitted light depends on a recombination current Ir, and the recombination current Ir is equal to the smaller one of the electron current Ie and the hole current Ih. Therefore, a portion, by which the larger one of the electron current Ie and the hole current Ih exceeds the smaller one, cannot be used for light emission, which causes a waste of energy and reduces luminous efficiency.

When the organic light emitting field effect transistor OLET emits light normally (i.e., in the above state 2 or 5), Vgs>Vth-e or |Vgs|>|Vth-h|, and Vgs−Vth-h≤Vds≤Vgs−Vth-e are satisfied. In this case, the electron current Ie and the hole current Ih are respectively as follows:

$$|Ie|=[\mu_e(Vgs-Vth-e)^2]*WCi/2L;$$

$$|Ih|=\{\mu_h[Vds-(Vgs-Vth-h)]^2\}*WCi/2L;$$

where $\mu_e$ and $\mu_h$ are mobilities of electrons and holes, respectively, Ci is a capacitance density of a gate insulation layer, W is a channel width, L is a channel length, and they are constants for a specific organic light emitting field effect transistor OLET.

Obviously, the organic light emitting field effect transistor OLET has the highest luminous efficiency when absolute values of the electron current Ie and the hole current Ih are equal to each other, that is, to achieve the highest luminous efficiency, the following formula should be satisfied:

$$[\mu_e(Vgs-Vth-e)^2]*WCi/2L=\{\mu_h[Vds-(Vgs-Vth-h)]^2\}*WCi/2L.$$

In the case of a grounded drain, for example, since Vds>0, the source voltage Vss>Vdd=0, and a boundary value Vgm of the gate voltage Vgg which can make the electron current Ie and the hole current Ih equal can be obtained:

$$Vgm = \frac{\sqrt{\mu_e}}{\sqrt{\mu_h}+\sqrt{\mu_e}}Vss + \frac{\sqrt{\mu_e}}{\sqrt{\mu_h}+\sqrt{\mu_e}}Vthe + \frac{\sqrt{\mu_h}}{\sqrt{\mu_h}+\sqrt{\mu_e}}Vthh.$$

That is, if the source voltage Vss and the drain voltage Vdd of the organic light emitting field effect transistor OLET maintain unchanged, when the gate voltage Vgg of the organic light emitting field effect transistor OLET (i.e., the data voltage Vdata) is increased in the range of 0 to Vgm (Vgg∈(0, Vgm)), the intensity of light emitted from the organic light emitting field effect transistor OLET depends on the electron current Ie, and therefore it can be considered that the brightness of the emitted light is monotonously increased as Vgg (i.e., Vdata) increases. When Vgg>Vgm, the hole current Ih is smaller and decreases as Vgg increases. Therefore, as the Vgg increases, the recombination current decreases, and the brightness of the emitted light begins to decrease.

Therefore, in the range of the conventional data voltage Vdata for driving, the compensation voltage Vb may be positively correlated with the data voltage Vdata, that is, as the gate voltage Vgg (i.e., Vdata) of the organic light emitting field effect transistor OLET increases, the voltage of the first electrode (source) thereof is no longer constant, but increases, so that the luminous efficiency can be improved. In some embodiments, Vb=βVdata, where β is a constant greater than 1, and therefore, the gate-source voltage $V_{gs}=(\beta-1)V_{data}$, which can better improve the luminous efficiency.

Figure 5:
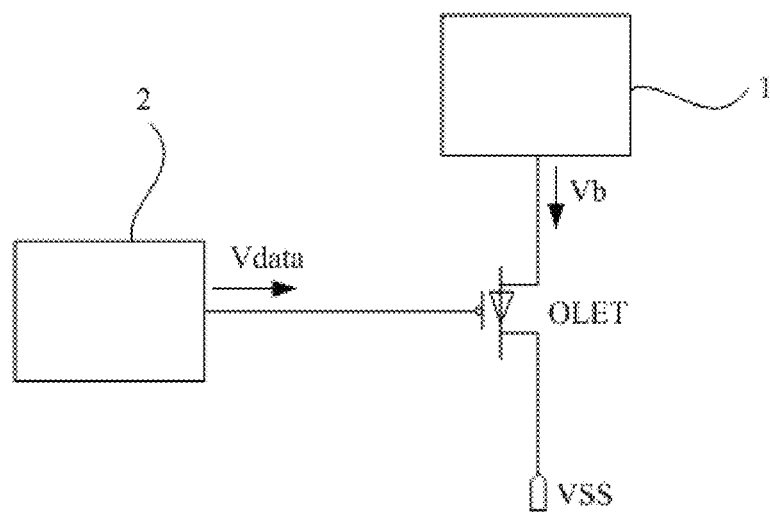
FIG. 5 is a schematic diagram of a structure of a light emitting unit according to an embodiment of the present disclosure.
Figure 6:
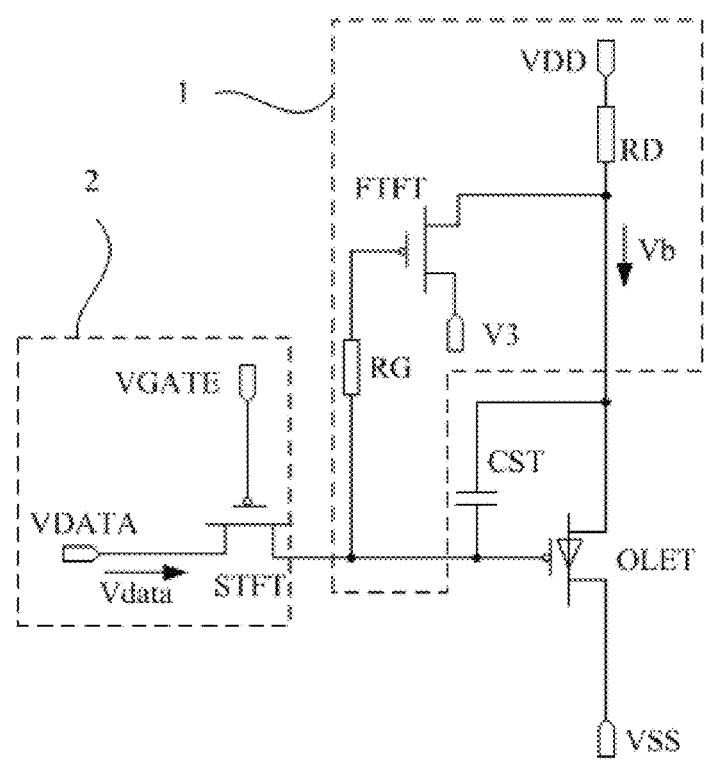
FIG. 6 is a schematic diagram of a light emitting unit according to an embodiment of the present disclosure.

In some embodiments, the drive circuit 0 includes a write circuit 2 and a compensation circuit 1, as shown in FIGS. 5 and 6. The write circuit 2 is coupled to the control electrode of the organic light emitting field effect transistor OLET and the compensation circuit 1, and configured to supply the data voltage Vdata to the control electrode of the organic light emitting field effect transistor OLET and the compensation circuit 1. The compensation circuit 1 is coupled to the write circuit 2 and the first electrode of the organic light emitting field effect transistor OLET and is configured to generate the compensation voltage Vb according to the data voltage Vdata provided by the write circuit 2 and supply the compensation voltage Vb to the first electrode of the organic light emitting field effect transistor OLET.

In an embodiment, the write circuit 2 includes a switching transistor STFT, and a gate of the switching transistor STFT is configured to receive a control signal, for example, by being coupled to a control terminal VGATE, and a first electrode of the switching transistor STFT is configured to receive a data signal, for example, by being coupled to a data voltage terminal VDATA, and a second electrode of the switching transistor STFT is coupled to the gate of the organic light emitting field effect transistor OLET.

The light emitting unit may serve as a sub-pixel in a display device, and since the number of sub-pixels is large, it is unlikely to provide a separate lead for each sub-pixel to introduce the data voltage Vdata. Therefore, the write circuit 2 may include a switching transistor STFT as shown in FIG. 6, and the turn-on/turn-off of the switching transistor STFT is controlled by the control terminal VGATE. In this way, the control terminals VGATE of the light emitting units in a same row may be coupled to a same gate, and the data voltage terminals VDATA of the light emitting units in a same column may be coupled to a same data line, so that the rows of the switching transistors STFT can be controlled to be turned on in turn through the gate lines, and corresponding data voltages Vdata can be sequentially written into each row through the data lines.

In some embodiments, the light emitting unit further includes: a storage capacitor CST having a first terminal coupled to the gate of the organic light emitting field effect transistor OLET and is configured to maintain the data voltage Vdata at the gate of the organic light emitting field effect transistor OLET.

As shown in FIG. 6, the gate of the organic light emitting field effect transistor OLET may also be coupled to the storage capacitor CST for maintaining the data voltage Vdata when the write circuit 2 does not directly supply the data voltage Vdata (e.g., when the switching transistor STFT is turned off), so that the organic light emitting field effect transistor OLET can maintain normal light emission.

In some embodiments, a second terminal of the storage capacitor CST is coupled to the first electrode of the organic light emitting field effect transistor OLET.

To simplify the circuit structure, the other terminal of the storage capacitor CST may be directly coupled to the first electrode of the organic light emitting field effect transistor OLET, so that the second terminal of the storage capacitor CST also has the compensation voltage Vb correlated with the data voltage Vdata.

Needless to say, it should be understood that the second terminal of the storage capacitor CST is not necessarily the compensation voltage Vb, and may be supplied with a constant voltage, for example, the second terminal may be coupled to a constant voltage terminal.

Needless to say, it should be understood that the data voltage Vdata may be directly supplied to the light emitting unit through a separate lead or the like. In this case, there may be no switching transistor or storage capacitor in the light emitting unit, and the write circuit 2 may be just one terminal and not include the switching transistor.

As an implementation of the embodiments, the compensation circuit 1 may include: a voltage dividing resistor RD having a first terminal coupled to a second constant voltage terminal VDD and a second terminal coupled to the first electrode of the organic light emitting field effect transistor OLET, and a voltage dividing transistor FTFT having a gate coupled to the gate of the organic light emitting field effect transistor OLET, a first electrode coupled to the first electrode of the organic light emitting field effect transistor OLET, and a second electrode coupled to a third constant voltage terminal V3.

That is, the compensation circuit 1 may be implemented as a part of the circuit in the light emitting unit, directly combined with the circuit (i.e., the switching transistor STFT, the organic light emitting field effect transistor OLET, and the storage capacitor CST) for realizing the core light-emitting function, instead of being implemented as an external device highly independent of the circuit for realizing the core light-emitting function, such as a chip. Such a compensation circuit 1 can generate a compensation voltage Vb according to the data voltage Vdata received by the light emitting unit on its own, and supply the compensation voltage Vb to the first electrode of the organic light emitting field effect transistor OLET. As shown in FIG. 6, the compensation circuit 1 includes a voltage dividing transistor FTFT (e.g., a field effect transistor) coupled between the third constant voltage terminal V3 and the first electrode of the organic light emitting field effect transistor OLET, and its gate is coupled to the gate of the organic light emitting field effect transistor OLET, and a voltage dividing resistor RD is provided between the second constant voltage terminal VDD and the first electrode of the organic light emitting field effect transistor OLET.

The above structure actually constitutes a "field effect transistor amplifying circuit", and the voltage dividing transistor FTFT operates in the amplification region. Therefore, the channel current in the voltage dividing transistor FTFT is controlled by the gate voltage of the voltage driving transistor FTFT, i.e., controlled by the data voltage Vdata, so that a current flowing through the voltage dividing resistor RD is also controlled by the data voltage Vdata, and the current can change the voltage drop across the voltage dividing resistor RD. Since the first terminal of the voltage dividing resistor RD is coupled to the second constant voltage terminal VDD having a constant voltage, the voltage at the second terminal (i.e., the first electrode of the organic light emitting field effect transistor OLET) is equal to the voltage Vdd of the second constant voltage terminal VDD minus the voltage drop across the voltage dividing resistor RD, and is the compensation voltage Vb. Therefore, the compensation voltage Vb is essentially controlled by the data voltage Vdata. In this way, the compensation voltage Vb correlated with the data voltage Vdata is supplied to the first electrode of the organic light emitting field effect transistor OLET.

The second electrode of the voltage dividing transistor FTFT is only required to be supplied with a constant voltage, and therefore, the voltage of the third constant voltage terminal V3 may be equal to the voltage of the first constant voltage terminal VSS.

The gate of the voltage dividing transistor FTFT may be coupled to the gate of the organic light emitting field effect transistor OLET through a protection resistor RG.

As shown in FIG. 6, a protection resistor RG for protection may be provided between the gate of the voltage dividing transistor FTFT and the gate of the organic light emitting field effect transistor OLET.

It could be understood that the compensation circuit 1 may also be other circuit having a voltage transformer function, such as an operational amplifier, as long as it can adjust the data voltage Vdata received from the write circuit 2 to be the compensation voltage Vb correlated with the data voltage Vdata. In some embodiments, the driving circuit 0 may include a voltage supply source 11 having a first output terminal coupled to the gate of the organic light emitting field effect transistor OLET and a second output terminal coupled to the first electrode of the organic light emitting field effect transistor OLET. The voltage supply source 11 is configured to supply the data voltage Vdata at the first output terminal and supply the compensation voltage Vb correlated with the data voltage Vdata at the second output terminal.

Figure 7:
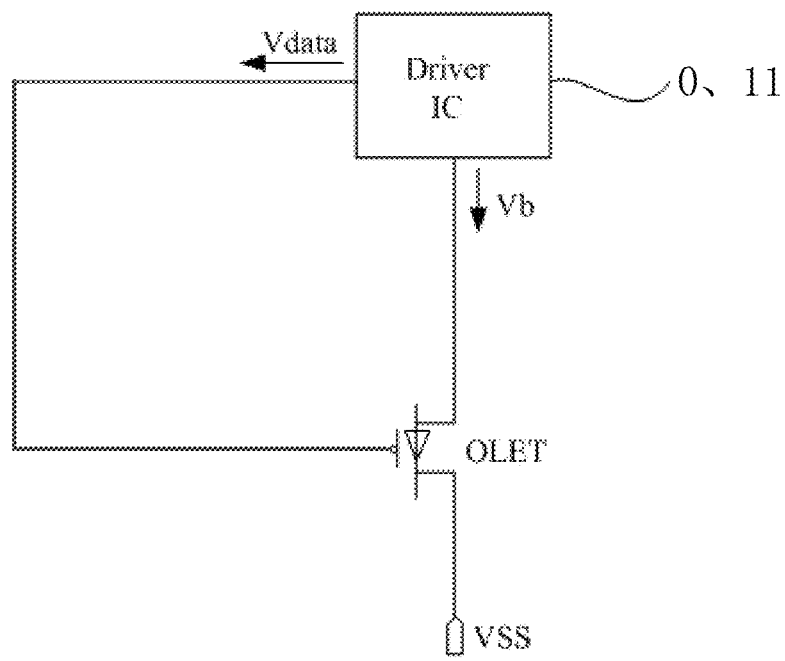
FIG. 7 is a schematic diagram of a structure of a light emitting unit according to an embodiment of the present disclosure.

That is, as shown in FIG. 7, the data voltage Vdata and the compensation voltage Vb may be directly supplied from two different terminals of a device capable of providing a specific voltage (e.g., a driver IC). Because the voltage supply source 11 can provide a controllable voltage, when a certain terminal outputs the data voltage Vdata, it is possible to calculate the corresponding compensation voltage Vb according to the data voltage Vdata and output the compensation voltage Vb through another terminal. Needless to say, since signals provided through different terminals of the driver IC are independently controllable, the requirement of Vb=βVdata can be satisfied.

In some embodiments, the driving circuit 0 may include a voltage supply source 11 and a voltage transformation circuit 12. An output terminal of the voltage supply source 11 is coupled to the write circuit 2, and is coupled to the first electrode of the organic light emitting field effect transistor OLET through the voltage transformation circuit 12. The voltage supply source 11 is configured to supply the data voltage Vdata at the output terminal; the voltage transformation circuit 12 is configured to change the data voltage Vdata supplied from the output terminal to the compensation voltage Vb.

Figure 8:
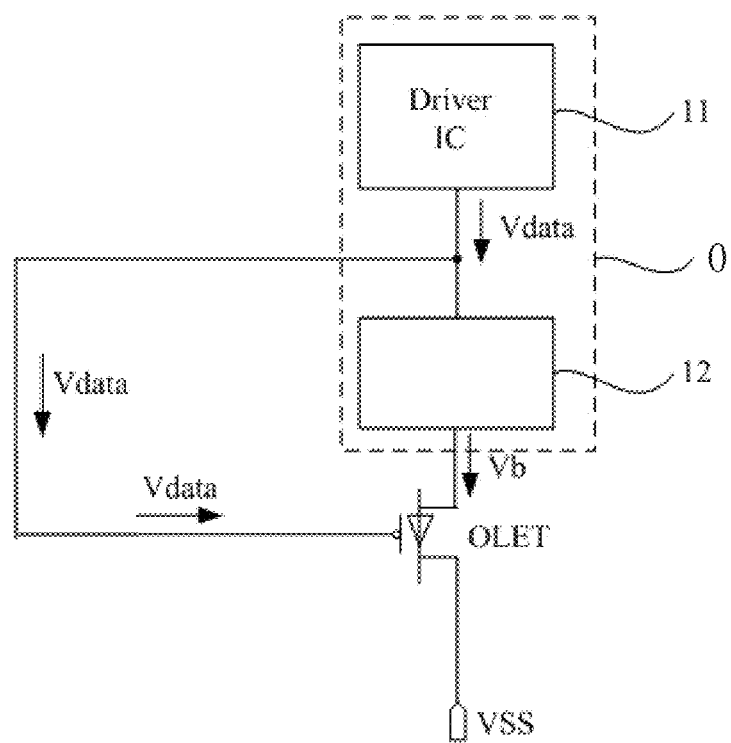
FIG. 8 is a schematic diagram of a structure of a light emitting unit according to an embodiment of the present disclosure.

That is, as shown in FIG. 8, a terminal of the voltage supply source 11 (e.g., driver IC) may be directly coupled to the gate of the organic light emitting field effect transistor OLET, and also coupled to the first electrode of the organic light emitting field effect transistor OLET through the voltage transformation circuit 12. When the terminal supplies the data voltage Vdata, the data voltage Vdata can be directly transferred to the gate of the organic light emitting field effect transistor OLET, and in the meanwhile, is converted into the compensation voltage Vb by the voltage transformation circuit 12, and the compensation voltage Vb is transferred to the first electrode of the organic light emitting field effect transistor OLET. In this way, two signals can be provided by using one terminal of the voltage supply source 11.

In an embodiment, the voltage transformation circuit 12 is configured to have a magnification of β, so that the above requirement of Vb=βVdata can be satisfied. The voltage transformation circuit 12 may be an operational amplifier (op-amp). An operational amplifier is a circuit that may have a very high amplification factor, and its output signal may be a result obtained by performing, on the input signal, a mathematical operation such as addition, subtraction, differentiation, or integration. Needless to say, it is also possible to use other circuit having a transformer function as the voltage transformation circuit 12.

Figure 9:
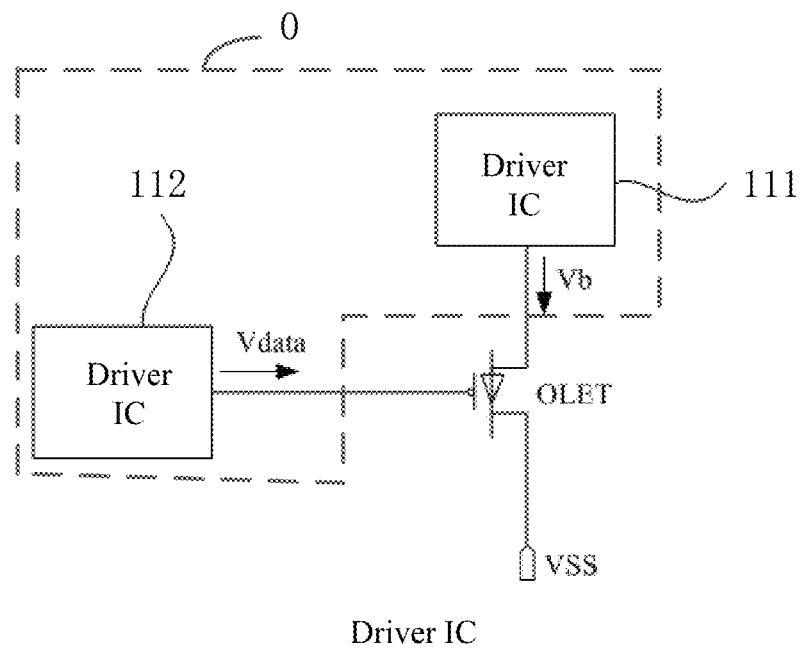
FIG. 9 is a schematic diagram of a structure of a light emitting unit according to an embodiment of the present disclosure.

In some embodiments, as shown in FIG. 9, the driving circuit 0 may include a first voltage supply source 111 and a second voltage supply source 112. An output terminal of the first voltage supply source 111 is coupled to the first electrode of the organic light emitting filed effect transistor OLET, and an output terminal of the second voltage supply source 112 is coupled to the control electrode of the organic light emitting filed effect transistor OLET. The second voltage supply source 112 is configured to supply a data voltage Vdata at the output terminal, and the first voltage supply source 111 is configured to supply a compensation voltage Vb correlated with the data voltage Vdata at the output terminal. Both the first voltage supply source 111 and the second voltage supply source 112 may be driver ICs. It could be understood that the first voltage supply source and the second voltage supply source may be controlled by a controller such that the voltage Vdata supplied by the second voltage supply source at its output terminal is positively correlated with the voltage Vb supplied by the first voltage supply source at its output terminal (e.g., Vb=βVdata, where β is a constant greater than one).

In another aspect, embodiments of the present disclosure further provide a driving method of the above light emitting unit, and the driving method includes:

supplying a data voltage to the gate of the organic light emitting filed effect transistor, supplying a compensation voltage correlated with the data voltage to the first electrode of the organic light emitting filed effect transistor, and supplying a first constant voltage to the first constant voltage terminal such that the organic light emitting field effect transistor emits light, the voltage at the first constant voltage terminal being lower than the compensation voltage.

To drive the above light emitting unit to emit light, the data voltage is supplied to the gate of the organic light emitting filed effect transistor, the compensation voltage is supplied to the first electrode of the organic light emitting filed effect transistor, and meanwhile the first constant voltage terminal (the second electrode of the organic light emitting filed effect transistor) remains at the first constant voltage, thereby lowering the power consumption.

The data voltage may be directly provided by a driver IC, or may be provided through gate lines and data lines and kept by a storage capacitor. The compensation voltage may be directly provided by a driver IC, or provided by transforming, outside the light emitting unit, the data voltage provided by a driver IC, or may be generated from the data voltage by an internal circuit of the light emitting unit.

In another aspect, embodiments provide a display device including a plurality of light emitting units as described above.

That is to say, the above light emitting unit may be used as a sub-pixel in a display device. In an embodiment, the plurality of light emitting units may be located on one substrate, and the display device further includes other conventional structures such as a counter substrate.

Needless to say, the display device is an OLET display device, which may be any product or component having a display function, such as an electronic paper, a mobile phone, a tablet computer, a television, a display, a notebook computer, a digital photo frame, a navigator, or the like.

Figure 10:
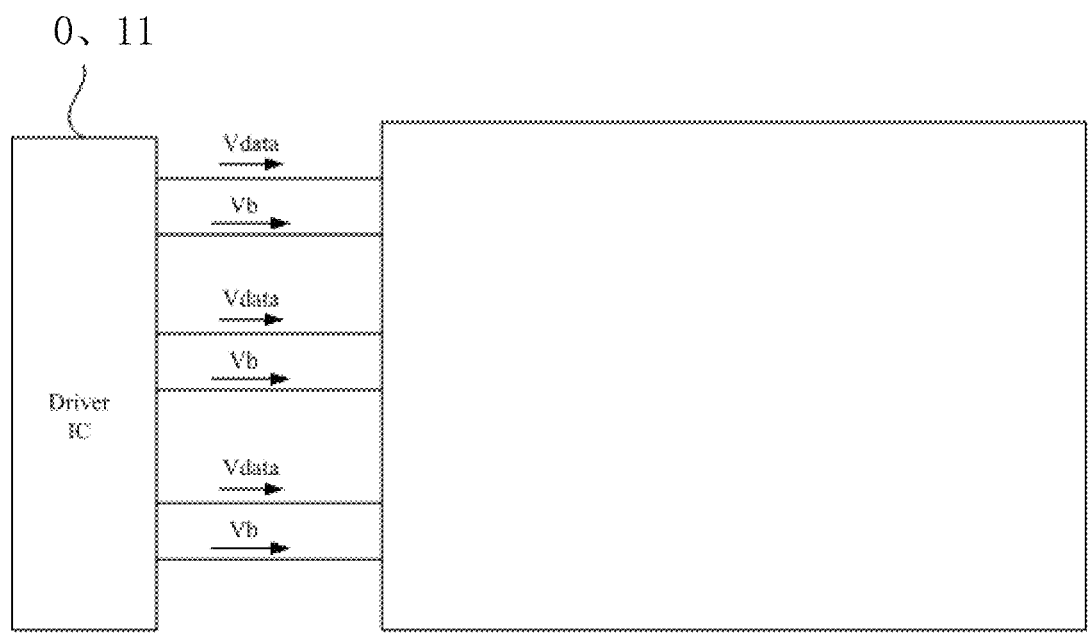
FIG. 10 is a schematic diagram of a structure of a display device according to an embodiment of the present disclosure.

In a case where the driving circuit in the light emitting unit includes the voltage supply source 11, the voltage supply sources 11 of the driving circuits of the plurality of light emitting units may be integrated. For example, in a case where the driving circuit of the light emitting unit includes only one voltage supply source 11, the voltage supply sources 11 of the driving circuits of the plurality of light emitting units may be integrated into one driver IC, as shown in FIG. 10.

Since one driver IC usually has a plurality of terminals, each of which has the ability to independently output a required voltage, one driver IC can be directly used as the voltage supply sources 11 in the driving circuits of the plurality of light emitting units.

Needless to say, each light emitting unit may correspond to two terminals of the driver IC (in the absence of the voltage transformation circuit 12), or correspond to only one terminal (in the presence of the voltage transformation circuit 12).

It could be understood that when the driving circuit of the light emitting unit includes two voltage supply sources 11 (i.e., the first voltage supply source 111 and the second voltage supply source 112), the first voltage supply sources 111 of the driving circuits of the plurality of light emitting units may be integrated into one driver IC, and the second voltage supply sources 112 of the driving circuits of the plurality of light emitting units may be integrated into another driver IC.

Needless to say, the light emitting unit may use its internal circuit as the compensation circuit (for example, the light emitting unit shown in FIG. 6). In this case, all devices in each light emitting unit (including an OLET, a storage capacitor, a compensation circuit, etc.) together constitute one sub-pixel, and at the same time, the sub-pixels are arranged in an array having a plurality of rows and a plurality of columns, and signals are supplied to the sub-pixels through gate lines and data lines. For example, write circuits of a plurality of light emitting units in a same row (e.g., gates of the switching transistors STFT of the write circuits) are coupled to a same gate line to obtain a control signal through the gate line, and write circuits of a plurality of light emitting units in a same column (e.g., first electrodes of the switching transistors STFT of the write circuits) are coupled to a same data line to obtain a data voltage through the data line.

It is to be understood that the foregoing implementations are merely exemplary implementations employed to explain the principles of the present disclosure, but the present disclosure is not limited thereto. Various modifications and improvements may be made by those skilled in the art without departing from the spirit and scope of the present disclosure, and these modifications and improvements are also considered to be within the protection scope of the present disclosure.

What is claimed is:

1. A light emitting unit, comprising an organic light emitting field effect transistor (OLET) and a driving circuit,
   wherein the driving circuit is coupled to a control electrode and a first electrode of the OLET, and is configured to provide a data voltage to the control electrode of the OLET and provide a compensation voltage correlated with the data voltage to the first electrode of the OLET; and
   a second electrode of the OLET is coupled to a first constant voltage terminal,
   the compensation voltage is positively correlated with the data voltage, and the compensation voltage Vb and the data voltage Vdata have following relationship: Vb=βVdata, where β is a constant greater than one.

2. The light emitting unit of claim 1, wherein the driving circuit comprises a voltage supply source having a first output terminal coupled to the control electrode of the OLET, and a second output terminal coupled to the first electrode of the OLET; and
   the voltage supply source is configured to supply the data voltage at the first output terminal and supply the compensation voltage at the second output terminal.

3. The light emitting unit of claim 1, wherein
   the driving circuit comprises a voltage supply source and a voltage transformation circuit, an output terminal of the voltage supply source is coupled to the control electrode of the OLET and an input terminal of the voltage transformation circuit, and an output terminal of the voltage transformation circuit is coupled to the first electrode of the OLET;
   the voltage supply source is configured to provide the data voltage at the output terminal thereof; and
   the voltage transformation circuit is configured to convert the data voltage into the compensation voltage.

4. The light emitting unit of claim 3, wherein
   the voltage transformation circuit is an operational amplifier.

5. The light emitting unit of claim 1, wherein the driving circuit comprises a first voltage supply source and a second voltage supply source,
   an output terminal of the first voltage supply source is coupled to the control electrode of the OLET;
   an output terminal of the second voltage supply source is coupled to the first electrode of the OLET;
   the first voltage supply source is configured to supply the data voltage at the output terminal thereof; and
   the second voltage supply source is configured to supply the compensation voltage correlated with the data voltage at the output terminal thereof.

6. The light emitting unit of claim 1, wherein the driving circuit comprises a write circuit and a compensation circuit, wherein:
   the write circuit is coupled to the control electrode of the OLET and the compensation circuit and is configured to supply the data voltage to the control electrode of the OLET and the compensation circuit; and
   the compensation circuit is coupled to the first electrode of the OLET and the write circuit, and is configured to generate the compensation voltage according to the data voltage supplied by the write circuit, and provide the compensation voltage to the first electrode of the OLET.

7. The light emitting unit of claim 6, wherein the compensation circuit comprises:
   a voltage dividing resistor having a first terminal coupled to a second constant voltage terminal and a second terminal coupled to the first electrode of the OLET; and
   a voltage dividing transistor having a control electrode coupled to the control electrode of the OLET and the write circuit, a first electrode coupled to the first electrode of the OLET, and a second electrode coupled to a third constant voltage terminal.

8. The light emitting unit of claim 7, wherein
   the control electrode of the voltage dividing transistor is coupled to the control electrode of the OLET through a protection resistor.

9. The light emitting unit of claim 6, wherein
the write circuit comprises a switching transistor having a control electrode configured to receive a control signal, a first electrode configured to receive the data voltage, and a second electrode coupled to the control electrode of the OLET.

10. The light emitting unit of claim 6, further comprising:
a storage capacitor having a first terminal coupled to the control electrode of the OLET and configured to maintain the data voltage of the control electrode of the OLET.

11. The light emitting unit of claim 10, wherein
a second terminal of the storage capacitor is coupled to the first electrode of the OLET.

12. The light emitting unit of claim 6, wherein the compensation circuit comprises an operational amplifier.

13. A display device, comprising a plurality of light emitting units arranged in multiple rows and multiple columns, at least part of the plurality of light emitting units being the light emitting unit of claim 1.

14. A display device, comprising a plurality of light emitting units arranged in multiple rows and multiple columns, each of the plurality of light emitting units being the light emitting unit of claim 1.

15. The display device of claim 14, wherein the driving circuit of the light emitting unit comprises a voltage supply source having a first output terminal coupled to the control electrode of the OLET, and a second output terminal coupled to the first electrode of the OLET; and the voltage supply source is configured to supply the data voltage at the first output terminal and supply the compensation voltage correlated with the data voltage at the second output terminal, and
the voltage supply sources of the driving circuits of the plurality of light emitting units are integrated into one driver IC.

16. The display device of claim 14, wherein the driving circuit of the light emitting unit comprises a first voltage supply source and a second voltage supply source; an output terminal of the first voltage supply source is coupled to the control electrode of the OLET; an output terminal of the second voltage supply source is coupled to the first electrode of the OLET; the first voltage supply source is configured to supply the data voltage at the output terminal thereof; and the second voltage supply source is configured to supply the compensation voltage correlated with the data voltage at the output terminal thereof, the first voltage supply sources of the driving circuits of the plurality of light emitting units are integrated into one driving chip, and the second voltage supply sources of the driving circuits of the plurality of light emitting units are integrated into another driving chip.

17. The display device of claim 14, wherein the driving circuit of the light emitting unit comprises a write circuit and a compensation circuit; the write circuit is coupled to the control electrode of the OLET and the compensation circuit and is configured to supply the data voltage to the control electrode of the OLET and the compensation circuit; the compensation circuit is coupled to the first electrode of the OLET and the write circuit, and is configured to generate the compensation voltage according to the data voltage supplied by the write circuit, and provide the compensation voltage to the first electrode of the OLET; the display device further comprises a plurality of gate lines and a plurality of data lines, the write circuits of the light emitting units in a same row are coupled to a same gate line to receive a control signal through the gate line, and the write circuits of the light emitting units in a same column are coupled to a same data line to receive the data voltage through the data line.

18. The display device of claim 14, wherein the compensation voltages respectively provided to the first electrodes of the OLETs in the plurality of light emitting units are independent of one another.

19. A driving method of a light emitting unit, the light emitting unit being the light emitting unit of claim 1, and the driving method comprising:
supplying a data voltage to the control electrode of the OLET, supplying a compensation voltage correlated with the data voltage to the first electrode of the OLET, and supplying a first constant voltage to the first constant voltage terminal such that the OLET emits light, wherein the first constant voltage is lower than the compensation voltage, the compensation voltage is positively correlated with the data voltage, and the compensation voltage Vb and the data voltage Vdata have following relationship: Vb=βVdata, where β is a constant greater than one.

* * * * *